(12) United States Patent
Tandy et al.

(10) Patent No.: US 6,524,881 B1
(45) Date of Patent: Feb. 25, 2003

(54) METHOD AND APPARATUS FOR MARKING A BARE SEMICONDUCTOR DIE

(75) Inventors: William D. Tandy, Boise, ID (US); Bret K. Street, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/645,904

(22) Filed: Aug. 25, 2000

(51) Int. Cl.[7] .............................................. H01L 21/00
(52) U.S. Cl. .............................. 438/69; 438/51; 438/54; 438/70
(58) Field of Search ............................. 438/51, 54, 69, 438/70

(56) References Cited

U.S. PATENT DOCUMENTS

| | | | |
|---|---|---|---|
| 4,375,025 A | 2/1983 | Carlson | 219/121.62 |
| 4,523,319 A | 6/1985 | Pfost | 428/318.6 |
| 4,585,931 A | 4/1986 | Duncan et al. | 438/113 |
| 4,594,263 A | 6/1986 | Folk et al. | 430/945 |
| 4,638,144 A | 1/1987 | Latta, Jr. | 430/338 |
| 4,654,290 A | 3/1987 | Spanjer | 283/81 |
| 4,707,722 A | 11/1987 | Folk et al. | 156/247 |
| 4,753,863 A | 6/1988 | Spanjer | 427/256 |
| 4,861,620 A | 8/1989 | Azuma et al. | 219/121.68 |
| 4,945,204 A | 7/1990 | Nakamura et al. | 257/668 |
| 5,118,369 A * | 6/1992 | Shamir | 156/64 |
| 5,329,090 A | 7/1994 | Woelki et al. | 522/2 |
| 5,357,044 A | 10/1994 | Tsuruta | 156/154 |
| 5,415,939 A | 5/1995 | Yeung | 428/318.6 |
| 5,840,614 A | 11/1998 | Sim et al. | 438/113 |
| 5,866,644 A | 2/1999 | Mercx et al. | 430/945 |
| 5,928,842 A | 7/1999 | Shinmoto et al. | 430/338 |
| 5,962,097 A | 10/1999 | Yamamoto et al. | 283/81 |
| 5,972,234 A * | 10/1999 | Weng et al. | 216/43 |
| 5,976,955 A | 11/1999 | Hodges | 156/247 |
| 5,985,377 A | 11/1999 | Corbett | 427/256 |
| 5,986,235 A | 11/1999 | Canella | 219/121.68 |
| 6,011,315 A | 1/2000 | Toyosawa et al. | 257/668 |
| 6,028,134 A | 2/2000 | Zhang et al. | 522/2 |
| 6,030,485 A | 2/2000 | Yamada | 156/154 |

* cited by examiner

Primary Examiner—Trung Dang
Assistant Examiner—William M. Brewster
(74) Attorney, Agent, or Firm—TraskBritt

(57) ABSTRACT

The present invention provides a method and apparatus for marking a semiconductor wafer or device. The method and apparatus have particular application to wafers or devices which have been subjected to a thinning process, including backgrinding in particular. The present method comprises reducing the cross-section of a wafer or device, applying a tape having optical energy-markable properties over a surface or edge of the wafer or device, and exposing the tape to an optical energy source to create an identifiable mark. A method for manufacturing an integrated circuit chip and for identifying a known good die are also disclosed. The apparatus of the present invention comprises a multi-level laser-markable tape for application to a bare semiconductor die. In the apparatus, an adhesive layer of the tape provides a homogeneous surface for marking subsequent to exposure to electro-magnetic radiation.

74 Claims, 5 Drawing Sheets

METHOD AND APPARATUS FOR MARKING A BARE SEMICONDUCTOR DIE

FIELD OF THE INVENTION

This invention relates generally to marking techniques for semiconductor wafers and devices. More specifically, the present invention relates to methods and apparatus using laser and other optical-energy reactive materials for marking the surface of a bare semiconductor die.

BACKGROUND OF THE INVENTION

An individual integrated circuit semiconductor die or chip is usually formed from a larger structure known as a semiconductor wafer, which is typically comprised primarily of silicon, although other materials such as gallium arsenide and indium phosphide are also sometimes used. Each semiconductor wafer has a plurality of integrated circuits arranged in rows and columns with the periphery of each integrated circuit being substantially rectangular. In response to the ever-increasing demand for smaller, higher performance semiconductor dice, wafers are typically thinned (i.e., have their cross sections reduced) by a mechanical and/or chemical grinding process. After thinning, the wafer is sawn or "diced" into rectangularly shaped discrete integrated circuits along two mutually perpendicular sets of parallel lines (streets) lying between each of the rows and columns thereof on the wafer. Hence, the separated or singulated integrated circuits are commonly referred to as semiconductor die or semiconductor dice. While semiconductor dice may carry information of the active surface thereof regarding the manufacturer, specifications, etc., such information cannot be easily read without the use of optical devices. Subsequent to the wafer-dicing process, individual semiconductor dice are commonly subjected to a marking process wherein various easily read information is placed on the backside or inactive side of the semiconductor die for purposes of corporate identity, product differentiation and counterfeit protection.

Recently, lasers have supplanted the ink stamping process as the quickest and most efficient way to mark finished bare semiconductor dice or packaged semiconductor dice. Thus, lasers are currently used to mark semiconductor dice with a manufacturer's logo, as well as alphanumeric marks and bar codes specifying the company's name, a part or serial number, or other information such as lot or die location. In particular, lasers have become especially useful in marking high production items such as bare or packaged semiconductor dice. The high speed and precision of laser marking makes their use highly desirable for high throughput automated processes.

Conventional laser marking techniques utilize a very high intensity beam of light to alter the surface of a semiconductor die directly by melting, burning, or abating the device surface directly, or by discoloration or decoloration of a laser reactive coating applied to a surface of the bare semiconductor die or packaged semiconductor die. The beam of light may be scanned over the surface of the bare semiconductor die or packaged semiconductor die in the requisite pattern, or can be directed through a mask which projects the desired inscriptions onto the desired surface of the bare semiconductor die or packaged semiconductor die. The surface or coating of the bare or packaged semiconductor die thus modified, the laser marking creates a reflectivity different from the rest of the surface of the bare or packaged semiconductor die.

Numerous methods for laser marking are known in the art. One method of laser marking involves applications where a laser beam is directed to contact the surface of a semiconductor device directly, as is illustrated in U.S. Pat. No. 5,357,077 to Tsuruta, U.S. Pat. No. 5,329,090 to Woelki et al., U.S. Pat. No. 4,945,204 to Nakamura et al., U.S. Pat. No. 4,638,144 to Latta, Jr., U.S. Pat No. 4,585,931 to Duncan et al., and U.S. Pat. No. 4,375,025 to Carlson. In these direct marking applications, the roughness of the laser-marked surface is different from that of the unmarked surface. Thus, the contrast generated by this type of laser marking is the result of several factors, including surface depressions and asymmetry in surface lines. The inscriptions created by burning the surface of the semiconductor die can therefore be read by holding the device at an angle to a light source. An additional factor that may affect the contrast is the remnants of any burnt compounds generated by the laser marking which have a different reflectivity from the original material.

Another method of laser marking makes use of various surface coatings, e.g., carbon black and zinc borate, of a different color than the underlying device material. When the laser heats the coating to the point of vaporization, a readable mark is created by virtue of the contrast in the two layers. An example of this type of marking method was described in U.S. Pat. No. 4,707,722 to Folk et al. The methods disclosed by Folk involve the deposition of an ablative coating made of electroless nickel layer, in a form highly absorptive of radiant energy, on a surface of a metal package. The ablative coating is then vaporized by a laser, allowing the shiny metal of the package to show through in the form of a mark.

A further method used in the marking of a chip uses materials known in the art to be capable of changing color when contacted by a laser beam. For example, U. S. Pat. No. 5,985,377 to Corbett, assigned to the assignee of the present invention, describes a laser reactive material, such as a material containing a B-stage epoxy with an added pigment of a desired color, that reacts with heat to form a new compound on the surface of the chip and subsequently cures to a desired color. Corbett additionally discloses use of an ink-bearing material, such as a ribbon, which transfers ink to the surface of a chip when exposed to a laser. U.S. Pat. No. 4,861,620 to Azuma discloses a laser-reactive coating formed of various pigments, incorporating mercury and other heavy metals, which will thermally decompose, and hence change colors, when heated to a predetermined temperature by a laser beam. The result is a mark having a different color from the background color of the chip package.

U.S. Pat. No. 4,753,863 to Spanjer describes a laser-markable molding compound incorporating titanium oxide and/or chromium oxide as a coloring material, polyamide, epoxy, or silicone as a plastic resin, and a filler made of silicon oxide or aluminum oxide. When exposed to a laser, the originally grey molding composition turns a bright gold color. U.S. Pat. No. 5,928,842 to Shinmoto et al. discloses a silicon and polyolefin resin-based marking composition which a laser will turn from dark brown to black.

Each of these marking methods, however, is subject to a number of drawbacks and limitations. In methods involving the laser marking of a bare die, the ideal result is that the burned portion of the surface of the semiconductor die becomes sufficiently roughened to become visibly distinguishable from the semiconductor die's intact smooth surface. However, the laser mark is not always easily recognizable due to insufficient contrast between the roughened and smooth surfaces. This is particularly the case with semiconductor dice that have been subjected to backgrinding as part of a wafer thinning process.

As a result of wafer thinning, the grinding wheel used to abrade silicon from the backside of a wafer having a plurality of locations of semiconductor dice formed thereon tends to create swirling patterns on the backside surface of the wafer and portions of swirling patterns on the backside surface of the semiconductor dice. These swirling patterns or portions thereof may be sufficiently rough to interfere with an ablative laser process—making it much more difficult to burn a distinguishing mark on the surface of the semiconductor die. As a further result of the operation of the grinding wheel, the pattern left by the grinding process varies for semiconductor dice taken from one side of the wafer as opposed to the other, thus adding to the difficulty of reading the mark. An additional problem with bare die laser marking is that the high intensity of the laser beam may cause thermal degradation of the bare or packaged semiconductor die, or even damage the internal circuitry of the semiconductor die directly.

Secondly, use of laser reactive coatings may not be advantageous for use in a high-throughput process since many of them take hours to cure. Moreover, many laser coatings will lose the desired degree of contrast when exposed to the elevated temperatures prevalent in semiconductor die burn-in tests. Further considerations may weigh against coatings that incorporate unsafe heavy metals, as well as coatings that add alpha particle or mobile ion sources known to cause degradation of semiconductor dice. Finally, many coatings are difficult and expensive to apply as they require the use of special apparatus and/or costly materials.

Accordingly, there exists a need for an inexpensive, quick, high-resolution, and high-quality mark that is compatible with existing semiconductor fabrication and testing processes. Two of several phases of the fabrication process that lend themselves to the introduction of a complementary technique for preparing semiconductor dice for laser marking are the backgrinding and dicing processes.

During conventional back-surface grinding treatments, a semiconductor wafer is thinned to a desired thickness by the mechanical action of a grinding wheel. In processing the semiconductor wafer, the circuit pattern-formed surface (the "active surface") of the e wafer is prevented from being stained or injured with grinding t rashes, etc., by a protective member or submount previously adhered to the circuit pattern-formed surface of the wafer via an automatic adhering apparatus. After applying the back surface grinding treatment, the protective member may remain or may be peeled off or dislodged, and the semiconductor wafer is sent to a subsequent dicing process. To support and transport the wafer for dicing, a carrier tape or film is typically applied to the back surface of the wafer. Following dicing, the semiconductor dice are marked with identifying information, and either stored, transported, or mounted on carrier substrates such as leadframes or circuit boards which will be populated with an individual semiconductor die or semiconductor dice. The carrier tape or film applied prior t o dicing is typically removed during the pick-and-place process of attaching singulated dice to the desired carrier substrate.

BRIEF SUMMARY OF THE INVENTION

The present invention provides a method and apparatus for marking a semiconductor wafer or semiconductor die. The method and apparatus have particular application to wafers or semiconductor dice which have been subjected to a thinning process, including backgrinding in particular. The present method comprises reducing the cross-section of a wafer or semiconductor die, applying a tape having optical energy-markable properties over a surface or edge of the wafer or semiconductor die, and exposing the tape to an optical energy source to create an identifiable mark. In one embodiment, a markable tape of the present invention is applied to a surface which has been roughened by exposure to an abrasive thinning process. The application of the tape creates a homogeneous surface suitable for the formation of an optical energy-induced mark, such as that formed by a laser, the mark rendered readable by virtue of the contrast provided by the tape. In a related embodiment, an adhesive affixed to a tape provides the markable properties of the tape. All, part, or only a residue of the tape may remain on the wafer or semiconductor die after the marking process. In this regard, the tape or a markable adhesive affixed thereon may be advantageously formed of thermally dissipating and/or anti-static types of materials. The tape additionally may have a coefficient of thermal expansion similar to, or the same as, the materials in the wafer or the device to which it is applied. Carrier tapes are also disclosed for complementary use in the present method wherein the tapes may be formed to have translucent properties, or to provide additional marking qualities.

In another embodiment, the markable tape is used in a method of manufacturing an integrated circuit semiconductor die. This method basically entails providing a semiconductor wafer, reducing the cross-section of the semiconductor wafer (for example, by backgrinding), applying the markable tape, dicing the wafer, and subjecting the diced wafer or individual die to an optical energy source to render a mark.

The invention further provides a method for identifying a known good die (KGD). In this method, various identifying test data are compiled and incorporated into an optical energy-generated mark which is formed after the application of a markable tape.

The invention also includes a laser-markable tape apparatus for use in marking bare semiconductor dice. The apparatus comprises a tape which makes use of a multi-level adhesive that includes an outermost layer formed of a mixture of electromagnetic radiation-curing components and adhesive. After application to a bare semiconductor die and exposure to an electromagnetic radiation source, the mixture layer cures and bonds to the die surface, rendering a homogeneous surface suitable for laser marking.

Other features and advantages of the present invention will become apparent to those of skill in the art through a consideration of the ensuing description, the accompanying drawings, and the appended claims.

DETAILED DESCRIPTION OF THE INVENTION

Figure 1A:
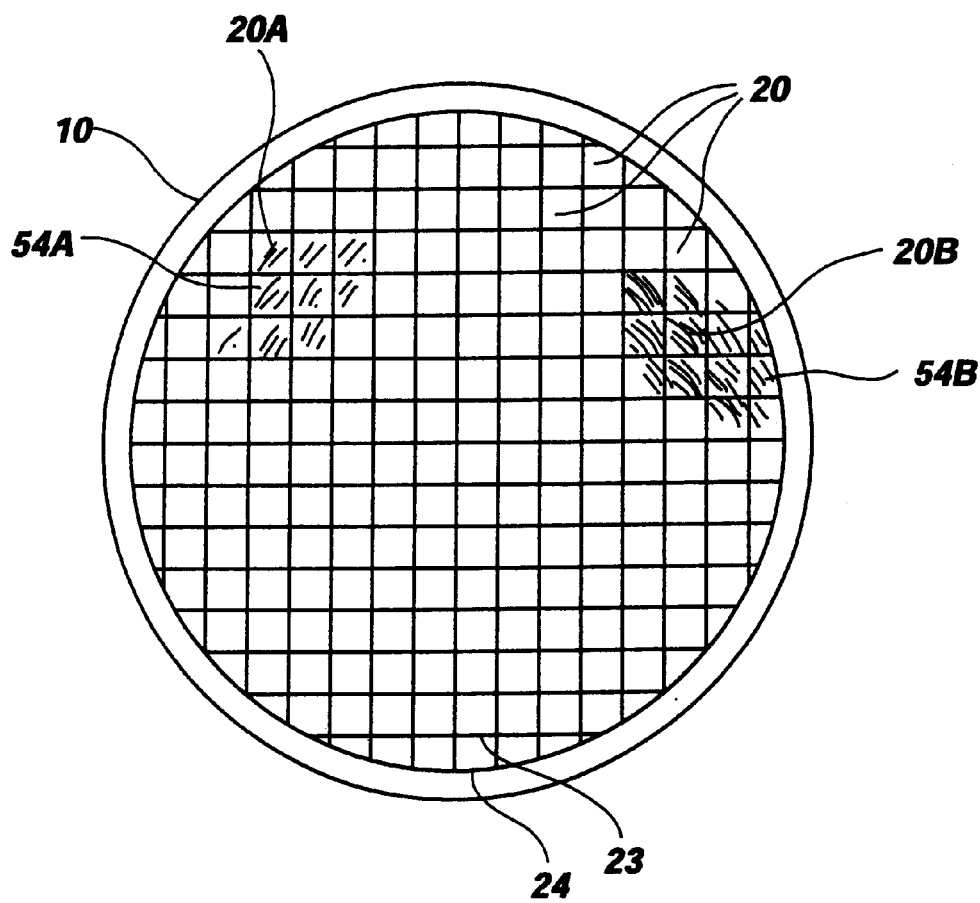
FIG. 1A illustrates a top view of a semiconductor wafer that has been thinned through use of a backgrinding wheel and subsequently diced.
Figure 1B:
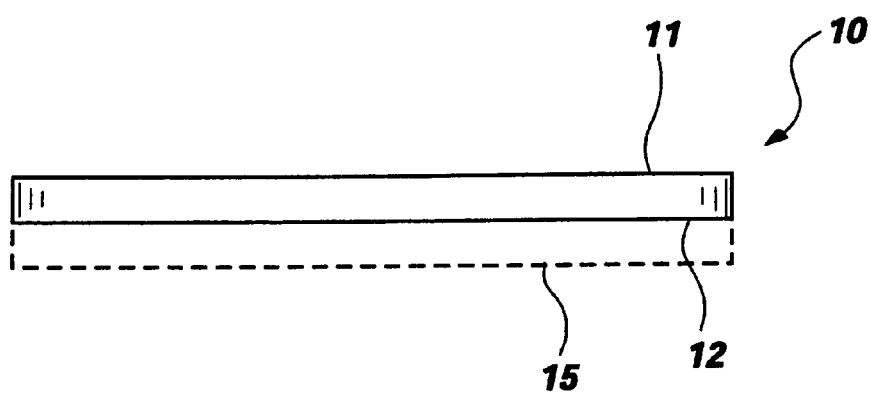
FIG. 1B depicts a side view of a semiconductor wafer wherein a thickness of the wafer has been ground away through a thinning process.

Referring to drawing FIG. 1A, illustrated is a semiconductor wafer 10 that has been subjected to a thinning process by abrasive application of a backgrinding wheel 52 (shown in FIG. 2), and then diced. Illustrated in drawing FIG. 1B, a side view of wafer 10 is shown wherein a thickness 15 of wafer 10 has been ground away (i.e., a cross-section has been reduced). Individual semiconductor dice 20 are shown of a tape typical to which the laser marking process of the present invention is particularly applicable. Semiconductor dice 20 are configured with opposing major surfaces, active surface 23 having bond pads located thereon and backside surface 24. In a conventional backgrinding process, a grinding wheel 52 (drawing FIG. 2) with grinding surface 53 grinds away semiconductor material from the backside surface 24 of semiconductor die 20 such that grooves or swirls remain on the backside surface 24 of fully thinned semiconductor die 20 (FIG. 1A).

Figure 2:
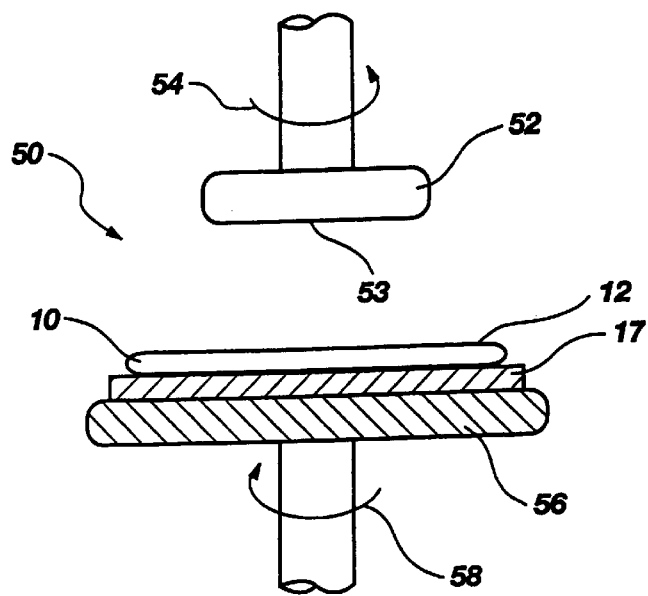
FIG. 2 illustrates a conventional backgrinding apparatus with a semiconductor wafer mounted thereon.

As shown by the arrows in drawing FIG. 2, grinding wheel 52 of backgrinding apparatus 50 typically rotates in one direction 54 while a platen 56 providing physical support for semiconductor wafer 10 rotates in another direction 58. This results in a grinding pattern that tends to vary from one side of semiconductor wafer 10 as opposed to the other (see drawing FIG. 1A). A submount 17, formed of tape, wax, molding compound etc., typically provides protection for the active surface 23 of the unsingulated semiconductor die 20 formed on semiconductor wafer 10 as well as structural support during the thinning process.

As can be seen in drawing FIG. 1A, after semiconductor wafer 10 has been diced, a semiconductor die 20A from the left side of the wafer may have grind marks 54A going from the upper left to lower right of its backside surface 12, while a semiconductor die 20B on the right side of the wafer may have grind marks 54B which extend from the semiconductor die's upper right to lower left. When bare semiconductor dice 20A and 20B are subsequently inscribed by a laser, two factors thus contribute to the difficulty of burning and optically reading a subsequently inscribed laser mark on a semiconductor die: the roughness due to the grooves created on the backside 24 of the semiconductor dice, and the differing groove patterns 54A and 54B for each wafer side which are created by the background process.

The various embodiments of the present invention provide solutions to the foregoing problem by covering grinding marks on a backside surface 12 of semiconductor wafer 10 with a flexible laser markable tape 1, or a material, dye or residue derived therefrom, thus providing a substantially smooth and homogeneous surface to which a laser mark can be applied and easily read. As used herein, the term "thinning process" is used to describe any of the various processes by which semiconductor wafers or integrated circuit dice have their cross-sections reduced. In a most preferred embodiment of the present method, thinning occurs by an abrasive backgrinding process as previously discussed. It is understood, however, that the various embodiments of the present invention apply to semiconductor dice which have been thinned by other processes as well, such as chemical mechanical polishing, as one example.

Most basically, the method of the present invention involves the following steps: reducing a cross-section of a said semiconductor device; applying a tape having optical energy-markable properties to at least a portion of a surface of said semiconductor device; and exposing at least a portion of said tape with optical energy to render a mark. This, and other embodiments, including variations thereof, are described in detail below.

Figure 3:
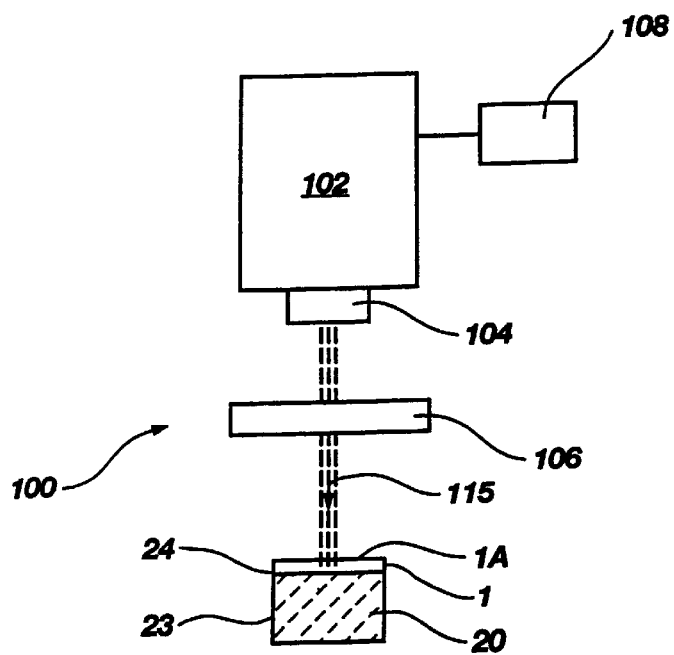
FIG. 3 shows a simplified schematic view of a conventional laser marking system capable of readily marking a semiconductor die to which an optical energy-markable tape has been applied.

Referring now to drawing FIG. 3, shown is a simplified schematic view of a conventional laser marking system 100 capable of readily marking semiconductor die 20 to which a laser markable tape 1 has been applied. The system comprises a laser 102, a lens system 104, a shadow mask 106, and a laser control system 108 for monitoring and controlling the function of the apparatus. For purposes of this invention, a "laser" is considered to be any optical energy source capable of marking a surface of a tape or a surface of a semiconductor die or wafer through the use of light energy and/or heat. Preferably, laser 102 is comprised of an Nd:YAG (yttrium aluminum garnet) laser, Nd:YLP (pulsed ytterbium fiber) laser, carbon dioxide laser, or other suitable optical energy devices known in the art. It is understood, however, that laser 102 may also comprise an ultraviolet (UV) energy source or other energy beam. When laser 102 is energized, an intense beam of light 115 is projected from lens system 104 through shadow mask 106 onto front-surface 1A of laser markable tape 1, laser markable tape 1 having been placed on the backside surface 24 of thinned semiconductor die 20. When, e.g., laser beam 115 impinges on laser markable tape 1, the material of, on, embedded in, attached to, or under laser markable tape 1 is altered, e.g., by heating, vaporization, burning, melting, chemical reaction, residue or dye transfer, or combinations thereof. The result comprises a color or texture change or both, having the image of shadow mask 106, appearing on the backside surface 24 of thinned semiconductor die 20. Although a shadow mask 106 is shown in this embodiment, the present invention also contemplates computer-directed operation, including mechanical movement, of laser 102 in conjunction with, or without, shadow box 106.

Figure 4B:
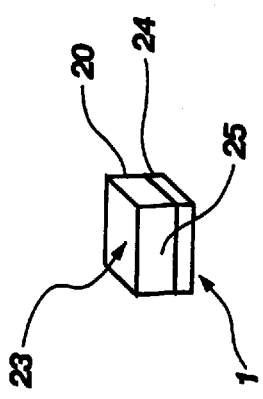
FIG. 4B illustrates a laser marking tape adhered to a backside surface of an individual semiconductor die with the carrier tape removed.
Figure 4A:
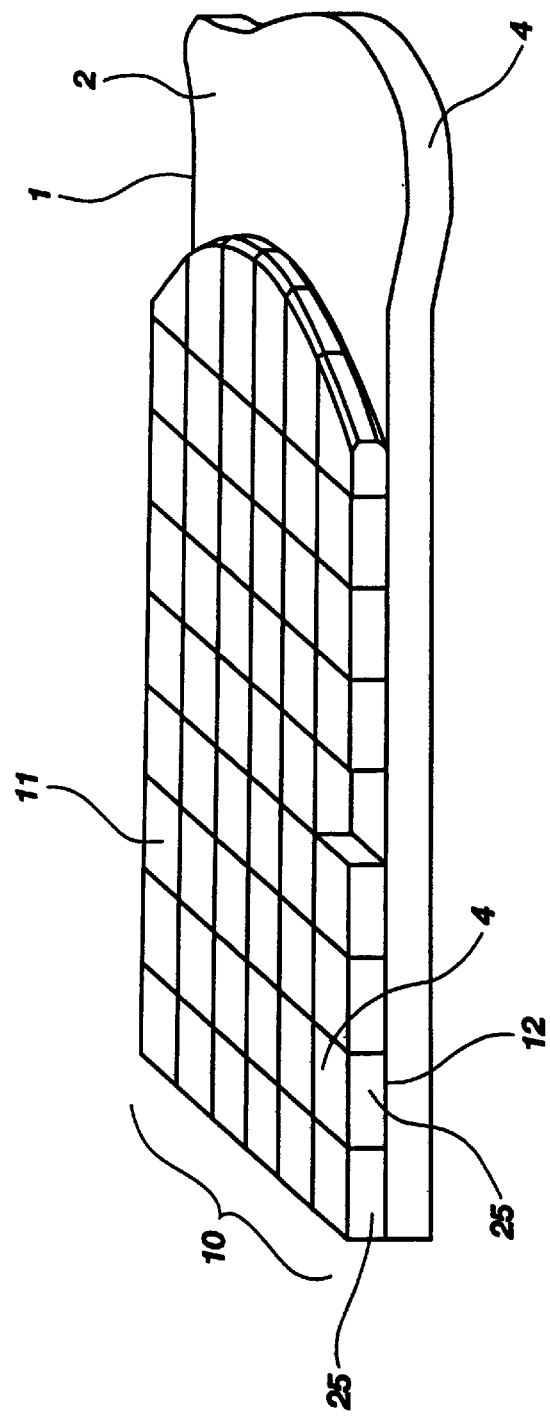
FIG. 4A shows an optical energy-markable tape and a carrier tape applied to a backside surface of a thinned semiconductor wafer.

With reference to drawing FIG. 4A, a first embodiment of the invention is shown wherein laser markable tape 1, also referred to as "marking tape 1", is applied to a backside surface 12 of semiconductor wafer 10 after it has been thinned through a backgrinding process, an example of which was depicted in drawing FIG. 2. Semiconductor wafer 10 is shown with its front-side 11 up, front-side 11 containing the circuit pattern-formed surface of the semiconductor wafer. A carrier or dicing tape 4 is shown as a second layer disposed over marking tape 1 for providing extra stability and support during the dicing of semiconductor wafer 10. In drawing FIG. 4B, marking tape 1 is shown adhered to backside surface 24 of individual semiconductor die 20 with carrier tape 4 removed.

Marking tape 1 is contemplated for use with a wide variety of semiconductor materials and may be applied in any manner known in the art, including, but not limited to, applying the tape by automated or manual processes, including pick and place or stamping apparatus; applying the tape after it has been pre-cut to the shape of a wafer or portions thereof; applying the tape in narrow or wide strips or swatches; applying the tape as a micromarkable surface; applying the tape to a surface of a wafer after the wafer has been diced; applying the tape to all or selected portions of the backside of a wafer or die; applying the tape to a surface of any of the various semiconductor dice known in the art, such as DIP, SIP, ZIP, PLCC, SOJ, SIMM, DIMM, LCC, QFP, SOP, TSOP, flip-chip, etc; applying the tape in a multilayer form comprising a combination of one or more other marking tape layers, separation layers, and/or carrier tape layers, etc. Marking tape 1 may thus be applied to a surface on the backside surface 24 of singulated and separated semiconductor dice. For singulated and separated semiconductor dice 20, marking tape 1 may also be applied to one or more edge surfaces 25 on the semiconductor dice, or to one or more edges 25 in combination with a backside surface 24 of semiconductor die 20 in one or several strips. Preferably, marking tape 1 is applied by an automated process such that marking tape 1 is applied in a highly regular and standard pattern corresponding to placement on predetermined, specific areas on singulated semiconductor dice 20, or on wafer areas which will correspond to individual semiconductor dice after singulation. As such, vision systems for reading marks on semiconductor dice can be adjusted to scan the desired marked areas.

Use of the terms "laser markable tape" and "marking tape" are intended to refer to any tape configured such that, upon impact or heating by a laser, component or inherent characteristics of the tape allow for the formation or transfer of a distinct and permanent or semi-permanent mark onto a surface of a semiconductor die. Examples include, but are not limited to, marking tapes designed to transfer inks, dyes, or paints, including fluorescing materials; marking tapes which comprise materials which will chemically react with a surface of the semiconductor die or another provided material to form a new compound (as the desired mark) of a contrasting color; marking tapes which will transfer a laser markable residue-type coating or adhesive onto a semiconductor die; marking tapes which have been "pre-marked" such that exposure to an energy source will reveal the mark; marking tapes with adhesives that serve as markable material; and marking tapes comprising materials, textures, and/or colors which contrast with each other or that of a surface of the semiconductor die and which will vaporize upon laser impact to allow an underlying tape or a semiconductor die color to show through.

Preferably, the laser marking tape used in the method of the pre sent invention will comprise materials which are resistant to blistering, bubbling, or release of volatile components when contacted with an energy source. One such tape material which is suitable for use in an ablative laser marking process is comprised of polytetrafluoroethylene (PFTE), a material which may be made colored with various pigments, and which is suitably resistant to blistering, bubbling, or release of volatile components when contacted with a laser beam.

By use of the phrase "forming a mark," the pre sent method contemplates the formation of any of a variety of types of marks, as well as a plurality, or sequence, of identifying marks or characters. Thus, a mark formed or rendered by the pre sent invention may constitute, for example, a corporate logo, a string of alphanumeric characters, a bar code, or a binary sequence. Therefore, a "mark," for purposes of the pre sent invention, is in the nature of any form of information which may be subsequently determined or identified by any means known in the art, including visual scan or otherwise.

Laser markable tape 1 preferably has an adhesive layer 2 formed on at least one side thereof, allowing laser markable tape 1 to be temporarily or permanently adhered to a surface on the backside 12 of semiconductor wafer 10, the level of adherence dependent upon the tape-laser application. Alternatively, an adhesive may be applied directly to a backside surface 12 of the semiconductor wafer 10 by spray, spin-on or deposition processes and the like. Adhesive layer 2 may comprise a pressure-sensitive adhesive, radiation-curable adhesive, B-stage epoxy, or any other adhesive variety known in the art with bonding strength and other characteristics consistent with the type of tape used for the purposes of the invention. For example, in applications where semiconductor die 20 is to be marked by ablation of one or more layers of marking tape 1 with a laser, an adhesive layer with permanent adherence to the die surface may be used for which various epoxy resins or other adhesives known in the art will prove suitable. In applications where inks, dyes, or paints embedded within or coating marking tape 1 are to be transferred to a surface of semiconductor die 20, marking tape 1 need only temporarily bond to semiconductor die 20 until the mark transfer takes place. Thereafter, marking tape 1 can be peeled or otherwise removed from the surface of semiconductor die 20. Laser markable adhesive layers which are contemplated for use in the pre sent invention include, but are not limited to, UV acrylics, thiolene, poly-paraxylylene (Paralene), urethanes, silicones, epoxies, and acrylics.

It is thus contemplated in one embodiment of the invention that adhesive layer 2 or the tape itself may be UV-sensitive or sensitive to other electromagnetic radiation so that there is a reduction in the stickiness, adhesiveness or the coefficient of friction of marking tape 1 when exposed to a pre determined wavelength of UV light or electromagnetic radiation. Typically, such a UV-sensitive tape can be formed, for example, of various photopolymerizable monomers and polymers, photo-initiators, cross-linking agents, and other photo-sensitive agents known in the art. Adhesive layer 2 may also be chemically solvable by any number of solvents, thermally impacted, or otherwise short-lived in its adhesive properties.

Figure 5:
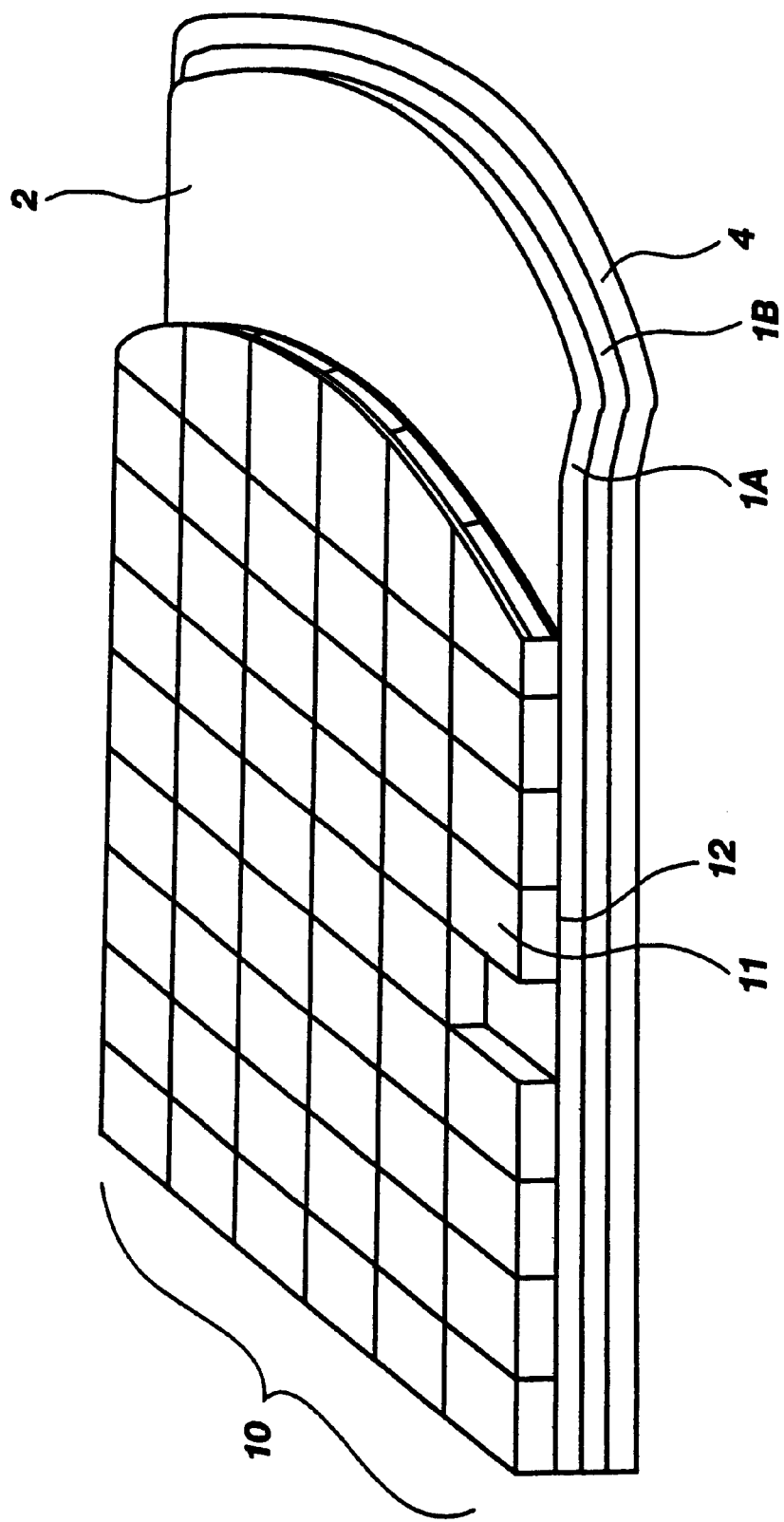
FIG. 5 shows multiple layers of laser markable tape and a carrier tape adhered to a backside surface of a thinned semiconductor wafer.

In another embodiment of the invention, marking tape 1 and its adherence properties are strong enough to provide support for the semiconductor wafer, in whole or in part, during the transportation, dicing, and/or lasing of semiconductor wafer 10. In a related aspect shown in drawing FIG. 5, marking tape 1 can be readily combined with a carrier or dicing tape 4, or with one or more added layers of marking tape 1B, or a combination of both. Carrier tape 4 can be any of a variety of carrier tapes known in the art for providing support and protection for semiconductor wafer 10 during various phases of the semiconductor wafer and semiconductor dice fabrication processes. The dual layer taping embodiment carries additional advantages during the dicing process in that the extra layer of tape allows for deeper and more complete cuts into the wafer, supplementary UV shielding, and added stability which can protect the thinned semiconductor wafers or semiconductor dice against chipping, splintering, fracturing, etc. during the various phases of the semiconductor fabrication process.

Figure 6:
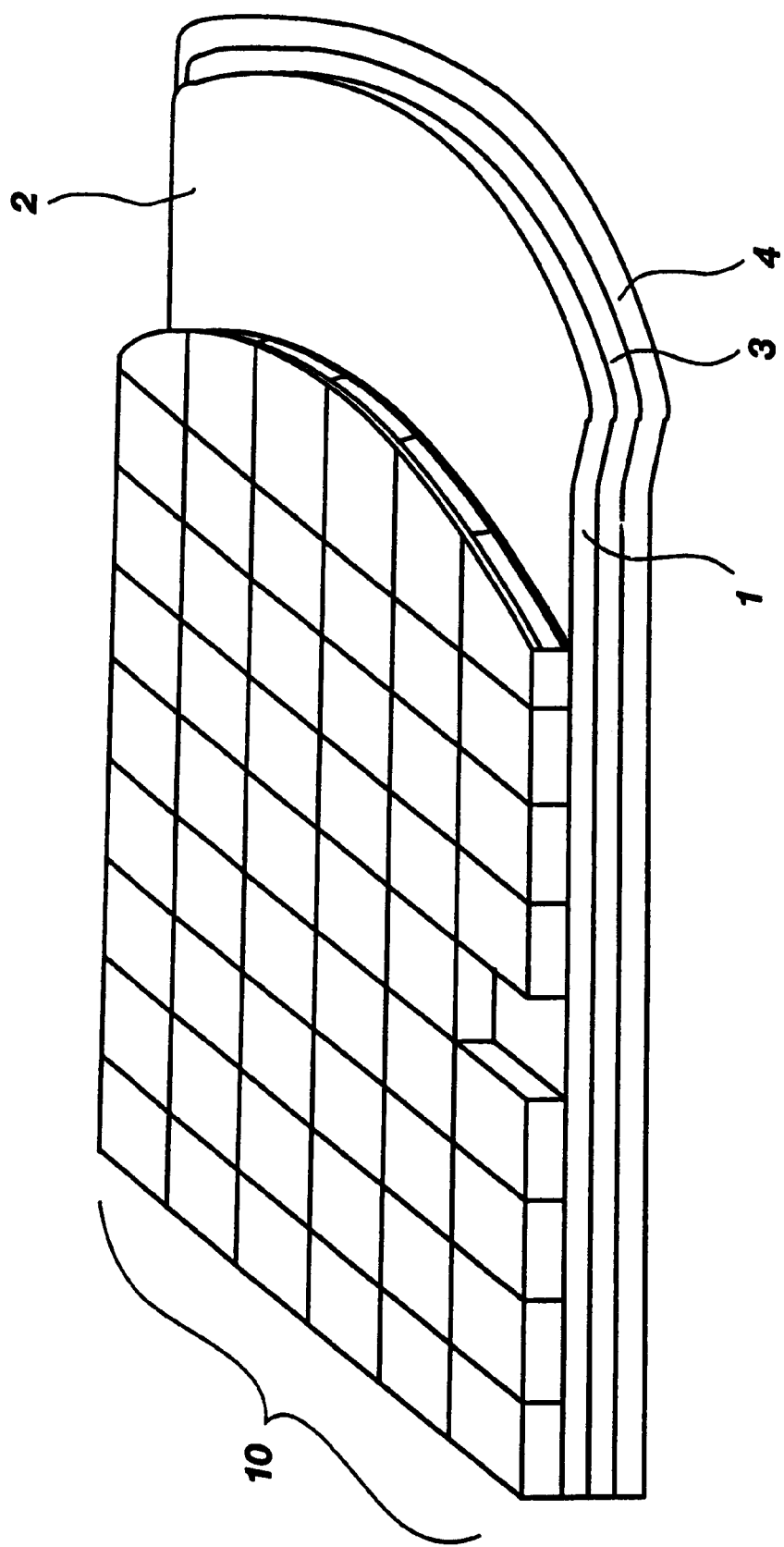
FIG. 6 shows a laser markable tape and a carrier tape separated by a intermediary separating tape.

Marking tape 1 and carrier tape 4 can also be separated by a intermediary separating tape 3 (drawing FIG. 6) that, in one embodiment, facilitates placement and/or removal of the carrier tape over marking tape 1. As previously described, it is also contemplated that a single layer of marking tape 1 and its adhesive layer 2 be sufficiently strong so as to provide the sole support for semiconductor wafer 10 during transportation and dicing.

In an aspect of the invention wherein marking tape 1 is combined with a carrier tape 4, carrier tape 4 may have translucent properties or be formed at a low density which allows light from a laser to penetrate carrier tape layer 4 and impact marking tape 1 to effect the mark.

Carrier tape 4 or an adhesive layer thereof may also be formed to be relatively weakly adhesive to marking tape 1, or a multi-level variation thereof, allowing for easy removal of the carrier tape prior to, after, or during the laser marking of semiconductor die 20. In a preferred embodiment, the adhesive layer of the carrier tape is UV (or electromagnetic radiation) sensitive such that upon exposure to UV light (or electromagnetic radiation), the adhesive properties of carrier tape 4 are reduced, and carrier tape 4 may be easily peeled away or removed from marking tape 1. One such carrier tape and adhesive combination suitable for purposes of the invention comprises a UV-penetrable polyvinyl chloride tape with an acrylic UV-sensitive adhesive.

As previously described, it is further contemplated that marking tape 1 can be applied in a plurality of marking tape layers 1B. In addition to providing added support and protection for the wafer, the marking tape layers can be constructed such that one or more tapes contain one or more pigments transferable to the surface of the die. Alternatively, materials comprising multiple layers of marking tape may be formed to chemically react with one another, and/or a surface of the semiconductor die, in the presence of a laser to form a discernable mark.

In a further embodiment involving a plurality of marking tapes, one or more of which may comprise contrasting colors, a first marking tape layer of a color is provided adhesively in contact with a surface of a bare semiconductor die. A second marking tape layer of a second color is disposed on the first marking tape layer, the color of which is selected to clearly contrast to that of the first layer. A laser beam is then controlled in intensity such that the outer second layer is pierced selectively, thus creating a detectable mark corresponding to the contrasting color of the lower marking tape layer. Three or more layers, preferably each of a different color, could also be utilized with one or more layers selectively pierced to create a desired mark. Preferably, the outer marking layers are formed to have a lower material density than the inner marking layers.

Preferably, marking tape 1 is formed of a material which has a similar coefficient of thermal expansion to that of the semiconductor die, and is advantageously made of a thermally dissipating material. Marking tape 1 can also have antistatic capacities for pre venting the generation of static electricity during the adhering or peeling of carrier layer 4. Antistatic properties can be produced in marking tape 1 by appropriate methods, including the introduction of antistatic or conductive agents during the formation of marking tape 1.

In another preferred embodiment, carrier tape 4 can be used in conjunction with one or more levels of adhesives, at least one of the adhesives comprising laser markable components when disposed on a surface of a bare semiconductor die 20. In one embodiment, a markable adhesive layer 2B serves to bind carrier tape 4 to a bare surface on the backside 12 of semiconductor wafer 10, and will transfer a laser markable residue to a surface of semiconductor die 20 when carrier tape 4 is later removed. In this case, carrier tape 4 functions to provide a support and protective function during semiconductor processing, but can be peeled away to effect transfer of the laser markable residue.

In a second related example, a carrier tape 4 with a multilayer adhesive can be used wherein a first layer of the multilayer adhesive comprises a mixture of electromagnetic radiation-curing components and an adhesive. The first mixture layer is formed of a type so as to cure and bond to a surface of a bare semiconductor die 20 upon exposure to a radiation source, whereupon it is laser markable. A second adhesive layer can be provided over the first mixture layer, the second adhesive layer providing adherence to both the first mixture layer and carrier tape 4. The second adhesive layer may also be formed to be electromagnetic radiation-curable and adhere to the first mixture layer and carrier tape 4 in an uncured state. Upon exposure to radiation, the second adhesive layer can either cure onto the first mixture layer or, alternatively, lose its adhesive properties and facilitate peeling of carrier tape 4 from a wafer or surface of a bare semiconductor die 20.

It is further contemplated that laser markable tape 1 and the other embodiments of the present invention may also be combined in an adjunct manner to, or as a component of, other laser, thermal, or related marking methods, such as use of various coatings, markable compounds or laser markable chemicals or films. The embodiments of the invention are further applicable to the remarking of previously marked dice which, for example, have been mis-marked, marked upside down or marked in a backwards fashion.

As previously discussed, the method of the pre sent invention is contemplated for use in rendering a myriad variety of marks, including marks for purposes of corporate identity, product differentiation and counterfeit protection. In a preferred embodiment, the various applications of creating a mark through use of marking tape 1 may be used in conjunction with semiconductor wafer or integrated circuit semiconductor die testing to identify a known good die (KGD). In such applications, previously thinned semiconductor wafers or individual integrated circuit semiconductor dice are subjected to burn-in, visual scans, or other processes known in the art to detect defects. Such defect data is then typically stored in a computer or other memory/data compiling device. Subsequent to receiving the results of such testing procedures, marking tape 1 is applied and exposed to an energy source and encoded with information comprising the results of the defect/known good die (KGD) tests. One of skill in the art will recognize that in carrying out this process, marking tape 1 in the various embodiments previously described may be applied to a surface of the semiconductor wafer or integrated before or after such defect testing.

It will be appreciated by those skilled in the art that the embodiments herein described while illustrating certain embodiments are not intended to so limit the invention or the scope of the appended claims. Those skilled in the art will also understand that various combinations or modifications of the preferred embodiments could be made without departing from the scope of the invention.

For example, this invention, while being described with reference to semiconductor wafers containing integrated circuits and individual semiconductor dice, has equal utility to any type of substrate to be inscribed. The embodiments of the pre sent invention are also contemplated for use on semiconductor wafer and semiconductor die surfaces other than a ground backside surface, and can be applied at any stage in the semiconductor die fabrication process. Accordingly, the invention can be utilized on the front-side, edges, or on an un-ground back-surface of a semiconductor wafer or semiconductor die. In addition, the invention may be applied to encapsulated semiconductor die packages.

Further, the pre sent invention has additional applicability to the laser marking of custom or non-standard IC's or other components, wherein a capability for rapid and easy die marking on a semiconductor wafer-by-semiconductor wafer or semiconductor die-by-semiconductor die basis is highly beneficial and cost-effective.

Thus, while certain representative embodiments and details have been shown for purposes of illustrating the invention, it will be apparent to those skilled in the art that various changes in the invention disclosed herein may be made without departing from the scope of the invention, which is defined in the appended claims.

What is claimed is:

1. A method of marking a semiconductor die comprising:
   reducing a cross-section of said semiconductor die;
   applying a tape having optical energy-markable properties to at least a portion of a surface of said semiconductor die;
   exposing at least a portion of said tape applied to said semiconductor die to optical energy; and forming a mark in at least a portion of the tape using said optical energy.

2. The method of claim 1, wherein said applying a tape having optical energy-markable properties to said at least a portion of a surface of said semiconductor die comprises applying said tape to a surface of said semiconductor die previously subjected to a thinning process.

3. The method of claim 2, wherein said thinning process comprises backgrinding.

4. The method of claim 1, wherein said semiconductor die comprises an integrated circuit semiconductor die.

5. The method of claim 1, wherein said step of applying a tape to said at least a portion of a surface of said semiconductor die includes applying said tape to an edge portion of said semiconductor die.

6. The method of claim 5, wherein said exposing at least a portion of said tape comprises exposing said tape on said edge portion of said semiconductor die.

7. The method of claim 1, wherein said optical-energy markable properties of said tape are embedded within said tape.

8. The method of claim 1, wherein said optical-energy markable properties of said tape comprise properties of at least one adhesive layer affixed to said tape.

9. The method of claim 8, wherein said at least one adhesive layer is selected from one of the group consisting of thiolene, poly-paraxylylene (Paralene), urethanes, silicones, epoxies, acrylics, or combinations of any thereof.

10. The method of claim 8, wherein said at least one adhesive layer is UV-sensitive.

11. The method of claim 8, wherein said at least one adhesive layer comprises a multi-layer adhesive having a first outermost layer comprising a mixture of electromagnetic radiation-curable components, and a second layer disposed between said tape and said first outermost layer.

12. The method of claim 1, further comprising applying a second tape over at least a portion of a surface of said tape, and wherein said exposing at least a portion of said tape includes exposing at least a portion of said second tape.

13. The method of claim 12, wherein said second tape is a carrier tape.

14. The method of claim 13, wherein said carrier tape includes a carrier tape having translucent properties.

15. The method of claim 13, wherein said second tape comprises a tape having optical energy-markable properties.

16. The method of claim 1, wherein said tape comprises polytetrafluoroethylene tape.

17. The method of claim 1, wherein said exposing at least a portion of said tape to said optical energy comprises exposing said at least a portion of said tape to one of a Nd:YAG (yttrium aluminum garnet) laser, Nd:YLP (pulsed ytterbium fiber) laser, or carbon dioxide laser.

18. The method of claim 1, wherein said exposing at least a portion of said tape to said optical energy comprises exposing said at least a portion of said tape to an ultraviolet light source.

19. The method of claim 18, wherein said tape comprises a UV-penetrable polyvinyl chloride tape having an acrylic UV-sensitive adhesive disposed thereon.

20. The method of claim 1, wherein said tape comprises a tape having antistatic capacities.

21. The method of claim 1, wherein said tape comprises a tape having a thermally dissipating material.

22. The method of claim 1, wherein said tape comprises a tape having a coefficient of thermal expansion substantially similar to that of said semiconductor die.

23. The method of claim 1, wherein said forming said mark includes one of heating, chemically reacting, or transferring of materials comprising said tape using said optical energy.

24. A method of manufacturing an integrated circuit semiconductor die comprising:
    providing a semiconductor wafer comprising integrated circuitry on a first surface thereof;
    reducing at least a portion of a cross-section of said semiconductor wafer;
    applying a tape having optical energy-markable properties to at least a portion of a second surface of said semiconductor wafer;
    exposing at least a portion of said tape applied to said semiconductor wafer to optical energy; and
    forming a mark in at least a portion of said tape by said exposing step.

25. The method of claim 24, further comprising:
    dicing said semiconductor wafer to create a plurality of individual integrated circuit semiconductor dice with said at least a portion of said tape thereon prior to said exposing said at least a portion of said tape to optical energy.

26. The method of claim 25, further comprising applying a carrier tape over said tape prior to said dicing of said semiconductor wafer.

27. The method of claim 24, wherein said reducing said at least a portion of a cross-section of said semiconductor wafer includes a backgrinding process.

28. The method of claim 27, wherein said step of applying a tape to at least a portion of a second surface of said semiconductor wafer includes applying said tape to a surface of said semiconductor wafer subjected to said backgrinding process.

29. The method of claim 24, wherein said step of applying a tape to at least a portion of a second surface of said semiconductor wafer includes applying said tape to an edge portion of said semiconductor wafer.

30. The method of claim 29, wherein said exposing at least a portion of said tape to form a mark comprises exposing said tape on said edge portion of said semiconductor wafer.

31. The method of claim 24, wherein said optical-energy markable properties of said tape are embedded within said tape.

32. The method of claim 24, wherein said optical-energy markable properties of said tape include properties of at least one adhesive layer affixed to said tape.

33. The method of claim 32, wherein said at least one adhesive layer is selected from one of thiolene, poly-paraxylylene (Paralene), urethanes, silicones, epoxies, acrylics, and combinations of any thereof.

34. The method of claim 32, wherein said at least one adhesive layer is UV-sensitive.

35. The method of claim 32, wherein said at least one adhesive layer includes a multi-layer adhesive having a first outermost layer comprising a mixture of electromagnetic radiation-curable components and a second layer disposed between said tape and said first outermost layer.

36. The method of claim 24, further comprising: applying a second tape over at least a portion of a surface of said tape; and exposing at least a portion of said second tape.

37. The method of claim 36, wherein said second tape is a carrier tape.

38. The method of claim 37 wherein said carrier tape includes translucent properties.

39. The method of claim 36, wherein said second tape comprises a tape having optical energy-markable properties.

40. The method of claim 24, wherein said tape comprises polytetrafluoroethylene tape.

41. The method of claim 24, wherein said exposing at least a portion of said tape to said optical energy includes exposing said at least a portion of said tape to one of a Nd:YAG (yttrium aluminum garnet) laser, Nd:YLP (pulsed ytterbium fiber) laser, or a carbon dioxide laser.

42. The method of claim 24, wherein said exposing at least a portion of said tape to said optical energy includes exposing said at least a portion of said tape to an ultraviolet light source.

43. The method of claim 42, wherein said tape is comprised of a UV-penetrable polyvinyl chloride tape with an acrylic UV-sensitive adhesive disposed thereon.

44. The method of claim 24, wherein said tape includes a tape having antistatic capacities.

45. The method of claim 24, wherein said tape includes a tape of a thermally dissipating material.

46. The method of claim 25, wherein said tape includes a tape having a coefficient of thermal expansion substantially similar to that of said plurality of individual integrated circuit semiconductor dice.

47. The method of claim 24, wherein forming said mark includes one of heating, chemically reacting, or transferring materials comprising said tape.

48. A method of identifying a known good die comprising:
   providing a semiconductor wafer comprising integrated circuitry on a first surface thereof;
   reducing at least a portion of a cross-section of said semiconductor wafer;
   testing at least one integrated circuit of said semiconductor wafer for defects;
   compiling data representing defect testing results;
   applying a tape having optical energy-markable properties to at least a portion of a second surface of said semiconductor wafer;
   exposing at least a portion of said tape applied to said semiconductor wafer to optical energy;
   forming at least one mark in at least a portion of said tape on at least a portion of said semiconductor wafer; and
   encoding said defect testing results onto portions of said wafer using said at least one mark.

49. The method of claim 48, further comprising:
   dicing said semiconductor wafer to create a plurality of individual integrated circuit semiconductor dice after said applying said tape.

50. The method of claim 49, wherein said encoding said defect testing results includes encoding said defect testing results on at least a portion of said plurality of individual integrated circuit semiconductor dice.

51. The method of claim 49, further comprising:
   applying a carrier tape over said tape prior to said dicing of said semiconductor wafer.

52. The method of claim 48, wherein said reducing said at least a portion of said cross-section of said semiconductor wafer includes a backgrinding process.

53. The method of claim 52, wherein said step of applying a tape to at least a portion of a second surface of said semiconductor wafer includes applying said tape to a surface of said semiconductor wafer subjected to said backgrinding process.

54. The method of claim 48, wherein said step of applying a tape to at least a portion of a second surface of said semiconductor wafer includes applying said tape to an edge portion of said semiconductor wafer.

55. The method of claim 54, wherein said exposing at least a portion of said tape to optical energy comprises exposing said tape on said edge portion of said semiconductor wafer.

56. The method of claim 48, wherein said optical-energy markable properties of said tape are embedded within said tape.

57. The method of claim 48, wherein said optical-energy markable properties of said tape include properties of at least one adhesive layer affixed to said tape.

58. The method of claim 57, wherein said at least one adhesive layer is selected from one of thiolene, polyparaxylylene (Paralene), urethanes, silicones, epoxies, acrylics, and combinations of any thereof.

59. The method of claim 57, wherein said at least one adhesive layer is UV-sensitive.

60. The method of claim 57, wherein said at least one adhesive layer includes:
   a multi-layer adhesive having a first outermost layer comprising a mixture of electromagnetic radiation-curable components; and
   a second layer disposed between said tape and said first outermost layer.

61. The method of claim 48, further comprising:
   applying a second tape over at least a portion of a surface of said tape; and
   exposing at least a portion of said second tape.

62. The method of claim 61, wherein said second tape is a carrier tape.

63. The method of claim 62, wherein said carrier tape includes a tape having translucent properties.

64. The method of claim 61, wherein said second tape includes a tape having optical energy-markable properties.

65. The method of claim 48, wherein said tape comprises polytetrafluoroethylene tape.

66. The method of claim 48, wherein said exposing at least a portion of said tape to optical energy includes exposing said at least a portion of said tape to one of a Nd:YAG laser (yttrium aluminum garnet), Nd:YLP laser (pulsed ytterbium fiber), or a carbon dioxide laser.

67. The method of claim 48, wherein said exposing at least a portion of said tape to optical energy includes exposing said at least a portion of said tape to an ultraviolet light source.

68. The method of claim 67, wherein said tape comprises a UV-penetrable polyvinyl chloride tape having an acrylic UV-sensitive adhesive disposed thereon.

69. The method of claim 48, wherein said tape includes a tape having antistatic capacities.

70. The method of claim 48, wherein said tape includes a tape of thermally dissipating material.

71. The method of claim 49, wherein said tape includes a tape having a coefficient of thermal expansion substantially similar to that of said plurality of individual integrated circuit semiconductor dice.

72. The method of claim 48, wherein forming said mark includes one of heating, chemically reacting, or transferring of materials comprising said tape.

73. The method of claim 48, wherein said testing said at least one integrated circuit of said semiconductor wafer for defects includes electrical testing of said semiconductor wafer.

74. The method of claim 48, wherein said testing said at least one integrated circuit of said semiconductor wafer for defects includes visually scanning said semiconductor wafer for defects.

* * * * *

UNITED STATES PATENT AND TRADEMARK OFFICE
CERTIFICATE OF CORRECTION

PATENT NO.       : 6,524,881 B1                                  Page 1 of 3
APPLICATION NO.  : 09/645904
DATED            : February 25, 2003
INVENTOR(S)      : William D. Tandy and Bret K. Street It is certified that error appears in the above-identified patent and that said Letters Patent is hereby corrected as shown below:

On the title page:

| | | |
|---|---|---|
| In item (54) Title, | LINE 2, | After "DIE" add --WITH A TAPE HAVING OPTICAL MARKING PROPERTIES -- |
| In item (56) References Cited, | LINE 13, | Change "5,357,044" to -- 5,357,077 -- |
| COLUMN 1, | LINE 2, | After "DIE" add --WITH A TAPE HAVING OPTICAL MARKING PROPERTIES -- |
| COLUMN 1, | LINE 38, | Change "backside" to -- back side-- |
| COLUMN 3, | LINE 7, | Change "backside" to -- back side-- |
| COLUMN 3, | LINE 41, | Change "back-surface grinding" to --back surface-grinding-- |
| COLUMN 3, | LINE 45, | Delete "e" after "the" and fill space |
| COLUMN 3, | LINE 46, | Change "t rashes," to -- trashes, -- |
| COLUMN 3, | LINE 49, | Change "surface grinding" to -- surface-grinding-- |
| COLUMN 3, | LINE 59, | Change "t o" to -- to -- |
| COLUMN 4, | LINE 42, | Change "electromagnetic" to -- electro-magnetic -- |
| COLUMN 4, | LINE 44, | Change "electromagnetic" to -- electro-magnetic -- |
| COLUMN 4, | LINE 66, | Change "backside" to -- back side -- |
| COLUMN 5, | LINE 5, | Change "backside" to -- back side -- |
| COLUMN 5, | LINE 8, | Change "a" to -- an -- |
| COLUMN 5, | LINE 23, | Change "backside" to -- back side -- |
| COLUMN 5, | LINE 25, | Change "backside" to -- back side -- |
| COLUMN 5, | LINE 27, | Change "backside" to -- back side -- |
| COLUMN 5, | LINE 44, | Change "backside" to -- back side -- |
| COLUMN 5, | LINE 52, | Change "backside" to -- back side -- |

UNITED STATES PATENT AND TRADEMARK OFFICE
CERTIFICATE OF CORRECTION

| | | |
|---|---|---|
| PATENT NO. | : 6,524,881 B1 | Page 2 of 3 |
| APPLICATION NO. | : 09/645904 | |
| DATED | : February 25, 2003 | |
| INVENTOR(S) | : William D. Tandy and Bret K. Street | |

It is certified that error appears in the above-identified patent and that said Letters Patent is hereby corrected as shown below:

| | | |
|---|---|---|
| COLUMN 5, | LINE 57, | Change "backside" to -- back side -- |
| COLUMN 6, | LINE 31, | Change "backside" to -- back side -- |
| COLUMN 6, | LINE 38, | Change "backside" to -- back side -- |
| COLUMN 6, | LINE 46, | Change "backside" to -- back side -- |
| COLUMN 6, | LINE 56, | Change "backside" to -- back side -- |
| COLUMN 6, | LINE 63, | Change "pick and place" to -- pick-and-place -- per first occurrence |
| COLUMN 7, | LINE 12, | Change "pre sent" to -- present -- |
| COLUMN 7, | LINE 44, | Change "pre sent" to -- present -- |
| COLUMN 7, | LINE 53, | Change "pre sent" to -- present -- |
| COLUMN 7, | LINE 57, | Change "pre sent" to -- present -- |
| COLUMN 7, | LINE 60, | Change "pre sent" to -- present -- |
| COLUMN 7, | LINE 67, | Change "backside" to -- back side surface -- |
| COLUMN 8, | LINE 3, | Change "backside" to -- back side -- |
| COLUMN 8, | LINE 10, | Insert-- a-- between "where" and "senconductor" |
| COLUMN 8, | LINE 22, | Change "pre sent" to -- present -- |
| COLUMN 8, | LINE 30, | Change "pre determined" to -- predetermined -- |
| COLUMN 8, | LINE 58, | Change "a intermediary" to -- an intenjedry --. |
| COLUMN 9 | LINE 43, | Change "pre venting" to -- preventing -- |
| COLUMN 9, | LINE 54, | Change "backside" to -- back  side -- |
| COLUMN 10, | LINE 49, | Change "pie sent" to -- present -- |
| COLUMN 10, | LINE 51, | Change "backside" to --back side-- |
| COLUMN 10, | LINE 57, | Change "pre sent" to --present-- |

UNITED STATES PATENT AND TRADEMARK OFFICE
CERTIFICATE OF CORRECTION

PATENT NO. : 6,524,881 B1
APPLICATION NO. : 09/645904
DATED : February 25, 2003
INVENTOR(S) : William D. Tandy and Bret K. Street It is certified that error appears in the above-identified patent and that said Letters Patent is hereby corrected as shown below:

| | | | |
|---|---|---|---|
| CLAIM 44, | COLUMN 13, | LINE 17, | Change "antistatic" to -- anti-static -- |
| CLAIM 69, | COLUMN 14, | LINE 49, | Change "antistatic" to -- anti-static -- |

Signed and Sealed this

Twenty-fourth Day of July, 2007

JON W. DUDAS
*Director of the United States Patent and Trademark Office*